United States Patent
Shrivastava et al.

(10) Patent No.: US 10,291,208 B1
(45) Date of Patent: May 14, 2019

(54) METHOD AND APPARATUS FOR ADJUSTING THE SLOPE OF INSERTION LOSS AS A FUNCTION OF FREQUENCY OF RF DIGITAL STEP ATTENUATORS

(71) Applicant: pSemi Corporation, San Diego, CA (US)

(72) Inventors: Ravindranath D. Shrivastava, San Diego, CA (US); Raul Inocencio Alidio, Carlsbad, CA (US)

(73) Assignee: pSemi Corporation, San Diego, CA (US)

( * ) Notice: Subject to any disclaimer, the term of this patent is extended or adjusted under 35 U.S.C. 154(b) by 0 days.

(21) Appl. No.: 16/030,567

(22) Filed: Jul. 9, 2018

(51) Int. Cl.
　　*H03H 11/24*　　(2006.01)
　　*H03G 1/00*　　(2006.01)
　　*H01F 38/14*　　(2006.01)

(52) U.S. Cl.
　　CPC ........... *H03H 11/245* (2013.01); *H01F 38/14* (2013.01); *H03G 1/007* (2013.01); *H03G 1/0088* (2013.01)

(58) Field of Classification Search
　　CPC ........ H03H 11/24; H03H 1/245; H03H 11/16; H03H 7/0115; H03H 7/38; H03H 7/487
　　USPC ................................................. 327/307, 308
　　See application file for complete search history.

(56) References Cited

U.S. PATENT DOCUMENTS

| | | | |
|---|---|---|---|
| 6,300,814 B1 | 10/2001 | Takahashi | |
| 6,828,873 B2 | 12/2004 | Ludwig et al. | |
| 8,022,785 B2 | 9/2011 | Zelenz | |
| 8,514,007 B1 | 8/2013 | Ahmed et al. | |
| 8,653,890 B1 | 2/2014 | Ahmed et al. | |
| 8,736,347 B2 | 5/2014 | Ahmed et al. | |
| 8,816,767 B2 | 8/2014 | Ahmed et al. | |
| 9,100,046 B2 | 8/2015 | Granger-Jones | |
| 9,444,432 B2* | 9/2016 | Shrivastava | H01F 38/14 |
| 10,003,322 B2 | 6/2018 | Lam | |
| 2013/0120061 A1 | 5/2013 | van der Zanden et al. | |
| 2014/0077874 A1 | 3/2014 | Ahmed et al. | |
| 2014/0253248 A1 | 9/2014 | Ahmed et al. | |
| 2016/0134259 A1 | 5/2016 | Shrivastava et al. | |

OTHER PUBLICATIONS

Nguyen, Hai L., Office Action received from the USPTO dated Nov. 13, 2015 for U.S. Appl. No. 14/538,694, 6 pgs.

(Continued)

*Primary Examiner* — John W Poos
(74) *Attorney, Agent, or Firm* — Jaquez Land Greenhaus LLP; Martin J. Jaquez, Esq.; Alessandro Steinfl, Esq.

(57) ABSTRACT

A method and apparatus for adjusting the slope of insertion loss of digital step attenuator (DSA). The DSA is implemented on an integrated circuit. The DSA has two series inductances that are introduced between the input of DSA cell and a resistor in the cell, and the output of DSA cell and another resistor in the cell. In one embodiment, adjustment in the value of the series inductances is as achieved by altering the locations of the input port and the output ports. In another embodiment, adjustment in the value of the inductances is achieved by tailoring the length and width of the conductor trace used to connect the input and output ports to the series resistors. The adjustment in the values of the inductances provides a means by which the roll-off of the insertion loss as a function of frequency in the attenuation state can be controlled.

7 Claims, 15 Drawing Sheets

(56) References Cited

OTHER PUBLICATIONS

Nguyen, Hai L., Office Action received from the USPTO dated Feb. 11, 2016 for Appl. No. 14/538,694, 11 pgs.
Nguyen, Hai L., Notice of Allowance received from the USPTO dated May 11, 2016 for U.S. Appl. No. 14/538,694, 8 pgs.
Shrivastava, et al., Response filed in the USPTO dated Jan. 6, 2016 for U.S. Appl. No. 14/538,694, 15 pgs.
Shrivastava, et al., Response filed in the USPTO dated Apr. 26, 2016 for U.S. Appl. No. 14/538,694, 15 pgs.
Nguyen Hai L., Office Action received from the USPTO dated Aug. 9, 2018 for U.S. Appl. No. 15/256,450, 17 pgs.
Nguyen Hai L., Office Action received from the USPTO dated May 14, 2018 for U.S. Appl. No. 15/256,450, 6 pgs.
Shrivastava, et al., Preliminary Amendment filed in the USPTO dated May 23, 2017 for U.S. Appl. No. 15/256,450, 11 pgs.
PSEMI Corporation., Response filed in the USPTO dated Jun. 28, 2018 for U.S. Appl. No. 15/256,450, 11 pgs.

\* cited by examiner

METHOD AND APPARATUS FOR ADJUSTING THE SLOPE OF INSERTION LOSS AS A FUNCTION OF FREQUENCY OF RF DIGITAL STEP ATTENUATORS

CROSS-REFERENCE TO RELATED APPLICATIONS

The present application may be related to U.S. Pat. No. 9,444,432, issued on Sep. 13, 2016, entitled "Digital Step Attenuator with Reduced Relative Phase Error", assigned to the applicant and assignee of the present application, the contents of which are hereby incorporated by reference in their entirety.

BACKGROUND

(1) Technical Field

The present teachings generally relate to radio frequency (RF) circuits, and more specifically to a method and apparatus for adjusting the slope of insertion loss as a function of frequency of RF digital step attenuators.

(2) Background

Generally, digital step attenuators (DSA) are used to attenuate RF signals without imparting a change to the phase of the attenuated signal. It is desirable that the slope of the insertion loss of DSA as a function of operating frequency in attenuation state track the slope of insertion loss as a function of operating frequency in the reference state. In particular, this is the case when RF signals are attenuated in two-stage amplifiers within a transceiver. In a two-stage amplifier, the output signal of the first stage amplifier may be coupled to a DSA in order to attenuate the signal prior to the signal entering the input of the second stage amplifier. When the signal from the first stage propagates through the DSA, it is important that the slope of the insertion loss of the DSA in all of its states as a function of operating frequency is relatively flat. A typical application for the two-stage amplifier with a DSA may be its use in a test and measurement device.

Operating frequencies of DSAs may range from 9 KHz up to 65 GHz. It is highly desirable that the slope of insertion loss of a DSA as a function of operating frequency in the attenuation state closely follows the slope in the reference state of the DSA. When the slope of insertion loss as a function of frequency in the attenuation state tracks the slope of insertion loss in the reference state, it assures that the DSA has the same amount of attenuation at different frequencies for a given attenuation setting.

FIG. 1 shows a two-stage amplifier with a DSA coupled between the first stage and the second stage. A signal is applied to the input 102 of the first stage 104. The signal propagates through first stage and the DSA 106 before entering at the input of the second stage 108. In the reference state, the attenuation through the DSA is minimal. When the DSA is in the attenuation state, it will attenuate the signal by a predetermined amount.

FIG. 2 depicts a graph of the insertion loss of the DSA as a function of operating frequency. The insertion loss is also referred to as a transmission scattering parameter, or S-parameter $S_{21}$. In this figure, frequency 204 is shown on the X-axis. The insertion loss $S_{21}$ 202 of the DSA is shown on the Y-axis. The $S_{21}$ of the DSA in the reference state is plotted as 206, while the $S_{21}$ in the attenuation state is plotted as 208.

In the illustrated example, the rate of change of $S_{21}$ as a function of frequency is referred to as the slope of $S_{21}$. The slope of $S_{21}$ as a function of frequency is relatively flat in the reference state. However, the slope of $S_{21}$ in the attenuation state varies as a function of frequency and $S_{21}$ rolls off at higher frequencies. This may cause the DSA to have different values of attenuation at different frequencies and thus may lead to non-linear operation of the two-stage amplifier.

Accordingly, there is a need for a method and apparatus for adjusting the slope of $S_{21}$ in order to mitigate its variation as a function of frequency.

SUMMARY

Various embodiments of a digital step attenuator (DSA) having characteristics such that the slope of the insertion loss as a function of operating frequency in attenuation state tracks the slope of the insertion loss as a function of operating frequency in the reference state are disclosed.

In one disclosed embodiment, a DSA cell is implemented on an integrated circuit (IC). The DSA cell has two resistors in series between an input and an output of the DSA cell. The DSA cell also includes two switch elements, which control whether the DSA operates in reference state or attenuation state. A first compensation inductance is introduced in series between the input to the DSA and the first resistor, and a second compensation inductance is introduced in series between the output of the DSA cell and the second resistor. The inductances introduce a pole in the transfer function of the DSA cell, such that the roll-off of the $S_{21}$ as a function of operating frequency in the attenuation state can be controlled. In particular, the slope of the $S_{21}$ as a function of operating frequency in the attenuation state can be made to match the slope of $S_{21}$ in the reference state over a desired frequency range. It will be understood by those skilled in the art that "to match the slopes" is defined as "the slopes being substantially the same" over a specified frequency range. The value of the series inductances may need to be adjusted in order to flatten the $S_{21}$ response of the DSA cell.

In a further embodiment, the adjustment in the values of the inductances is achieved by altering the locations of the input port and the output ports in the layout of the DSA IC. In another embodiment, the adjustment in the values of the inductances is achieved by tailoring the length and width of the conductor trace used to connect the input and output ports to the series resistors. In yet another embodiment, the adjustment in the values of the inductances is achieved by choosing the relative disposition of the layout of the series resistances with respect to the layout of the switch elements. The adjustment in the values of the inductances provides a means by which the roll-off of the $S_{21}$ as a function of operating frequency in the attenuation state can be controlled.

In some embodiments, the disclosed method may have an added benefit that the return loss of the DSA cell in attenuation state can also be reduced. Return loss, also referred to as a reflection scattering parameter, or S-parameter $S_{11}$, can be reduced by optimizing the value of a parasitic inductance, or shunt inductance, that exists between the connection point of the two series resistors and the ground.

In yet another embodiment, a method for controlling slope of insertion loss of a digital step attenuator (DSA) as a function of frequency is presented, the method comprising: providing a DSA having an input port; an output port; a first switch element having an input terminal, an output terminal and a control terminal, the output terminal coupled to the input port; a first resistive element having a first terminal and a second terminal; a first inductive coupling having an inductance, the first inductive coupling electrically connecting the output terminal of the first switch element to the first terminal of the first resistive element; a second inductive coupling having an inductance, the second inductive coupling electrically connecting the input terminal of the first switch element to the second terminal of the first resistive element, wherein the first inductive coupling is a conductive trace coupling the output terminal of the first switch to the first terminal of the first resistive element, adjusting positive or negative roll-off of slope of insertion loss as a function of frequency of the DSA by configuring one or more of length of the first conductive trace, width of the first conductive trace, and location of the input port, thus adjusting the slope of the insertion loss for a desired frequency range.

In yet another alternate embodiment, a digital step attenuator (DSA) is presented, the DSA comprising: an input port; an output port; a first switch element having an input terminal, an output terminal and a control terminal, the output terminal coupled to the input port; a first resistive element having a first terminal and a second terminal; a first inductive coupling having an inductance, the first inductive coupling electrically connecting the output terminal of the first switch element to the first terminal of the first resistive element; a second inductive coupling having an inductance, the second inductive coupling electrically connecting the input terminal of the first switch element to the second terminal of the first resistive element, wherein the first inductive coupling is a conductive trace coupling the output terminal of the first switch to the first terminal of the resistive element, the first conductive trace having a length and a width configured to establish a desired inductance for the first inductive coupling.

BRIEF DESCRIPTION OF THE DRAWINGS

The disclosed method and apparatus, in accordance with one or more various embodiments, are described with reference to the following figures. The drawings are provided for purposes of illustration only and merely depict examples of some embodiments of the disclosed method and apparatus. These drawings are provided to facilitate the reader's understanding of the disclosed method and apparatus. They should not be considered to limit the breadth, scope, or applicability of the claimed invention. It should be noted that for clarity and ease of illustration these drawings are not necessarily made to scale.

Like reference numbers and designations in the various drawings indicate like elements.

DETAILED DESCRIPTION OF THE INVENTION

Figure 1:
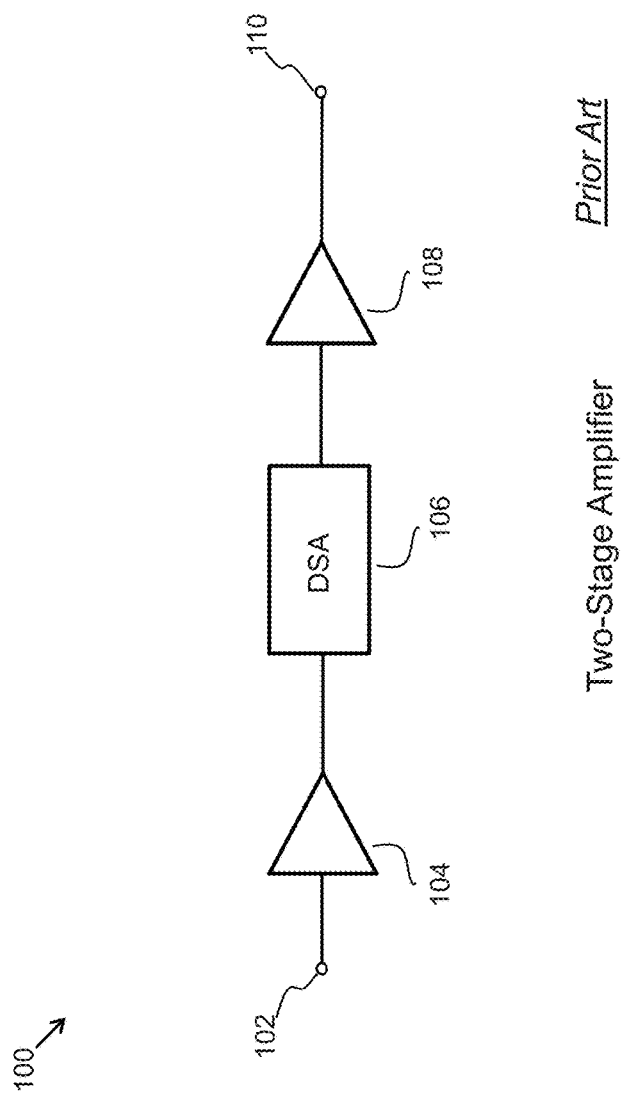
FIG. 1 is a prior art simplified block diagram of a two-stage amplifier. A DSA is depicted as block 106.
Figure 2:
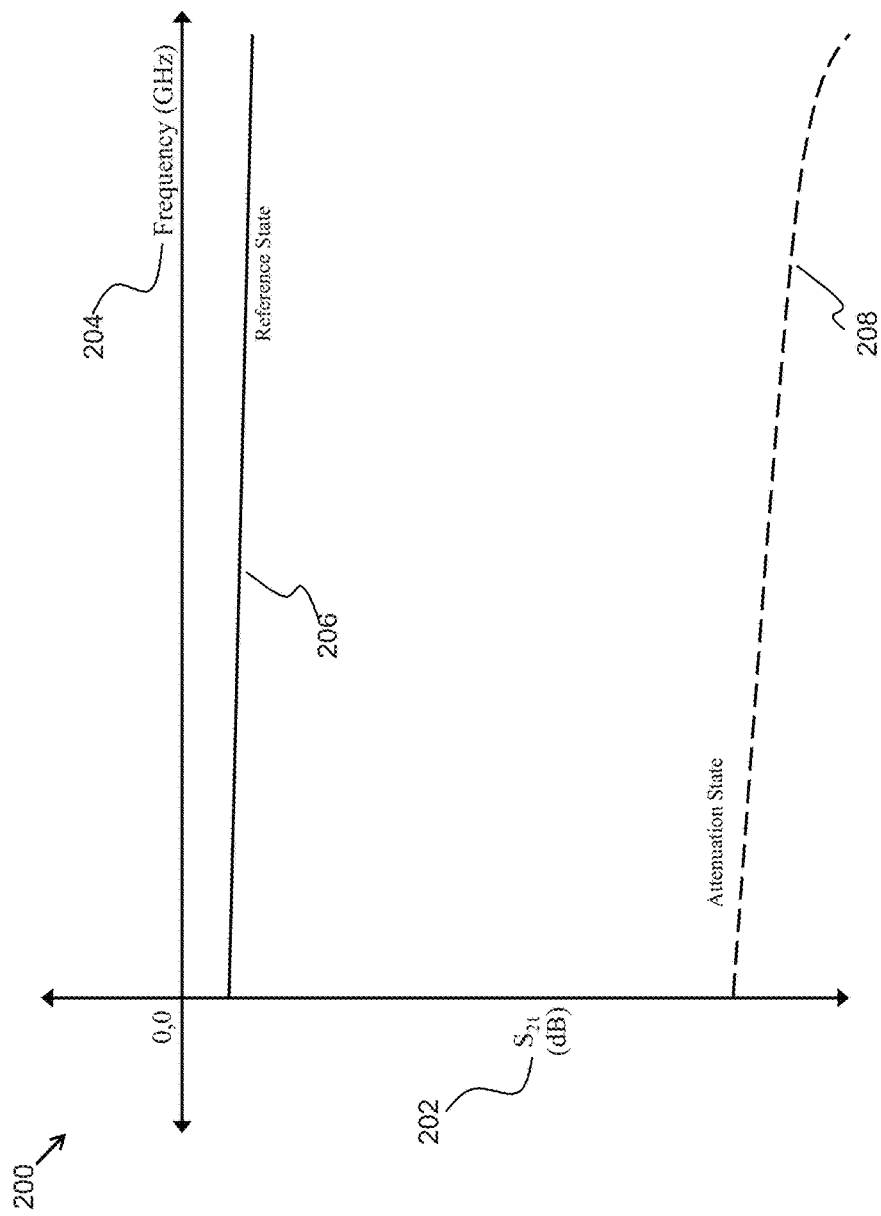
FIG. 2 shows a prior art graph of insertion loss $S_{21}$ as a function of operating frequency in the reference state and in the attenuation state.
Figure 3:
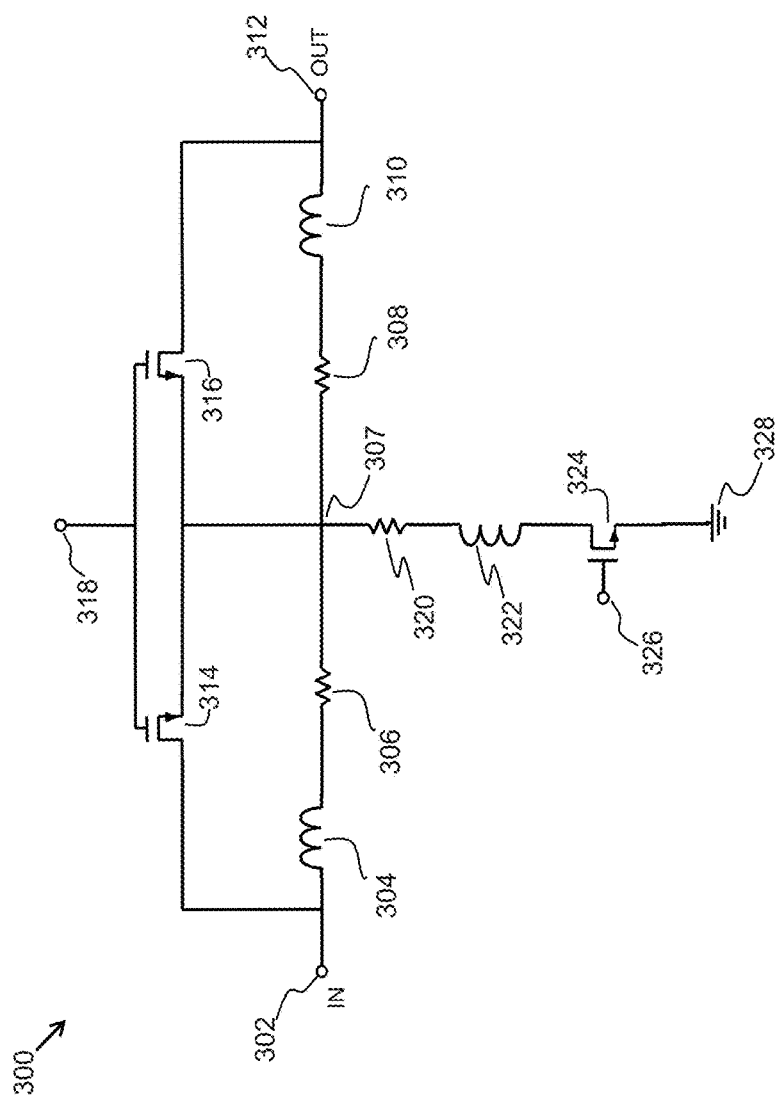
FIG. 3 is an electrical schematic of a DSA cell in accordance with one embodiment of the disclosed apparatus.
Figure 6:
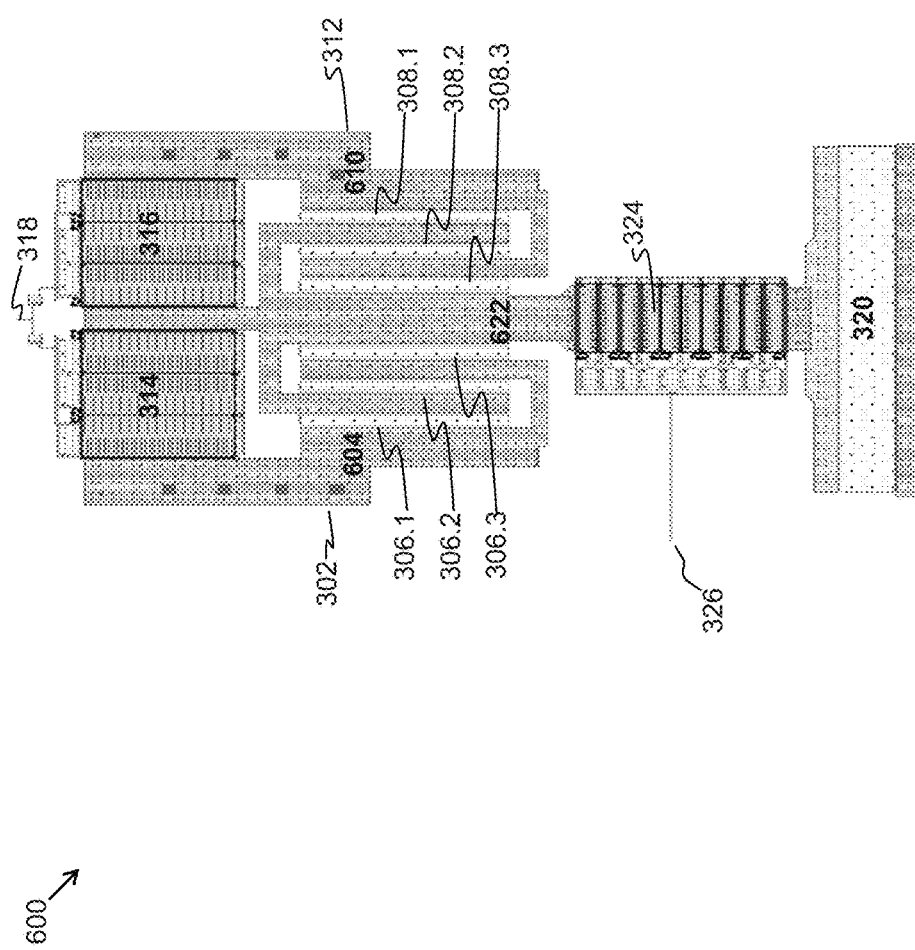
FIG. 6 shows an integrated circuit (IC) layout of the DSA cell with the electrical schematic in FIG. 3, in accordance with one embodiment of the presently disclosed apparatus, in which two series compensation inductances have higher values.

FIG. 3 shows an electrical schematic of a digital step attenuator (DSA) cell 300 in accordance with one embodiment of the disclosed apparatus. FIG. 6 shows an integrated circuit (IC) layout of the DSA cell schematic 300. Components of the layout shown in FIG. 6 have the same reference number as the schematic symbol representing the component in FIG. 3. The operation of the schematic 300 is described in more detail below after a brief description of schematic 300.

As shown in FIG. 3, the DSA cell has an input port 302 that allows the DSA cell to receive an input from an external source. The input port 302 is coupled to an inductance 304. In FIG. 6, this inductance is a conductive trace 604 that has an inductance value, which is modeled as a lumped element inductor 304 as shown in schematic of FIG. 3. However, it will be understood by those skilled in the art that the inductance 304 is distributed over the length of the conductive trace 604.

The inductor 304 is coupled to a resistor 306. The resistor 306 is coupled to another resistor 308 at a connection point 307. The resistor 308 is coupled to another inductor 310. In one embodiment, the inductors 304 and 310 have the same value of inductance. The inductor 310 is coupled to an output port 312.

The input port 302 is also coupled to a switch element 314. In accordance with one embodiment of the disclosed apparatus, the switch element 314 is a field effect transistor (FET). In a preferred embodiment, the FET is an N-type MOSFET. The switch element 314 is coupled to another switch element 316 at the connection point 307. In accordance with an alternative embodiment of the disclosed apparatus, the switch elements 316 is FET. In a preferred embodiment, this FET is an N-type MOSFET. In yet another preferred embodiment, the FETs 314 and 316 have the same size and same characteristics, and the gates of FETs 314 and 316 are coupled together at connection point 318. The switch 316 is further coupled to the output port 312.

A resistor 320 is coupled to the connection point 307 at one end and coupled to an inductor 322 at the opposite end. The inductor 322 is coupled to a switch element 324. In accordance with an alternative embodiment of the disclosed apparatus, the switch element 324 is a FET, with its gate coupled to a control point 326 and its source coupled to ground 328. The electrical schematic shown in FIG. 3 is a T-attenuator.

The operation of a DSA cell in accordance with embodiments of the presently disclosed apparatus will now be described in more detail. The DSA cell operates in the reference state when the signal received at the input port 302 is passed through to the output port 312 with minimal attenuation. In accordance with one embodiment of the disclosed apparatus, this is achieved by having both switch elements 314 and 316 in the ON mode, and having the switch element 324 in the OFF mode, which allows the received signal to pass through the DSA with minimal attenuation. The DSA operates in the attenuation state when switch elements 314 and 316 are in the OFF mode, and switch element 324 is in the ON mode. To be clear, ON mode of a switch is understood to be the low resistive mode and the OFF mode of a switch is understood to be the high resistive mode.

In the attenuation state, the series inductors 304 and 310 create a pole in the transfer function, which balance out the zero at high frequencies. Without the series inductors 304 and 310, the zero introduced by the OFF mode source-to-drain capacitance of the FETs 314 and 316, in combination with series resistances 306 and 308 will result in the insertion loss having a positive roll-off, or less attenuation with increasing frequency. On the other hand, if the value of the series inductors 304 and 310 is too high, it would lead to an increase in the slope of insertion loss as a function of operating frequency, that is, a negative roll-off, or more attenuation with increasing frequency.

Figure 4:
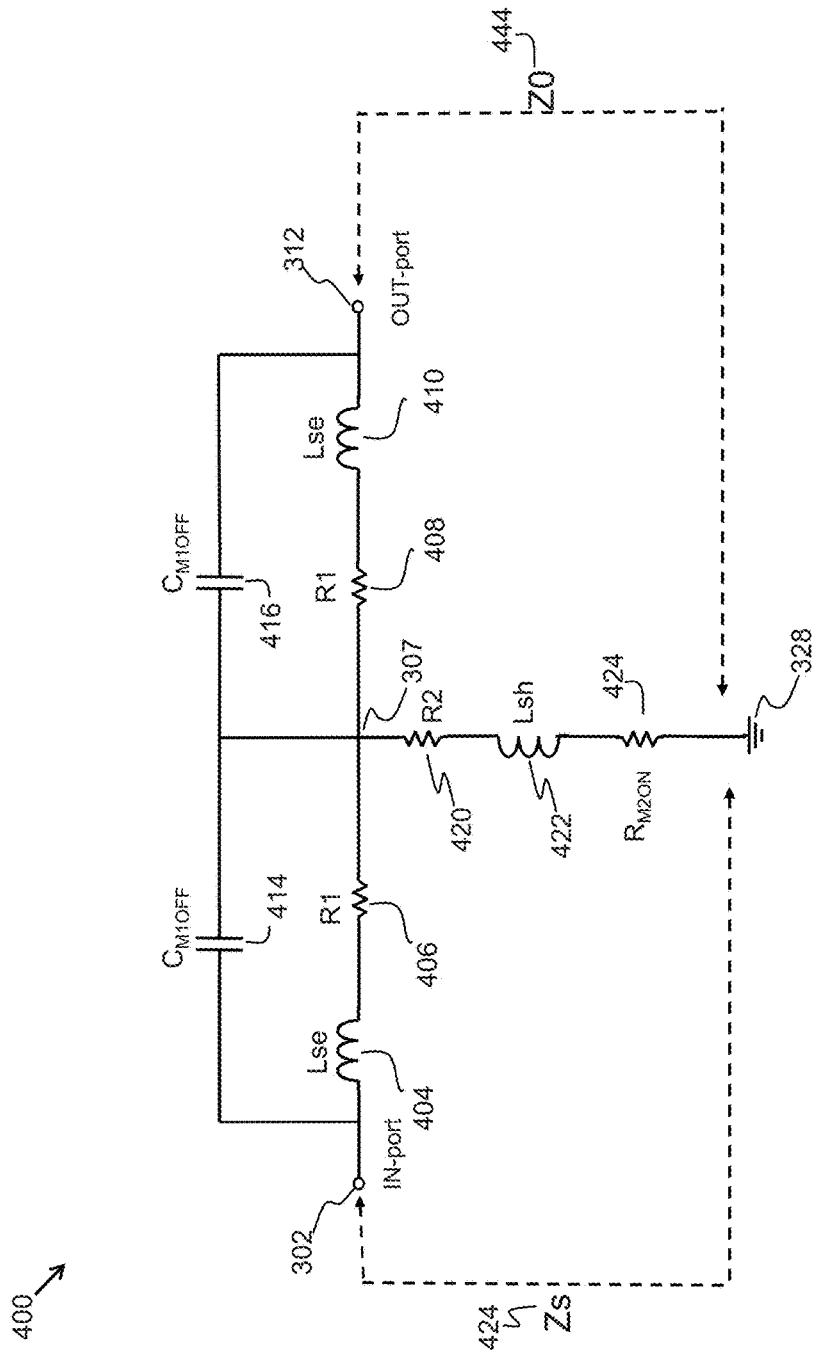
FIG. 4 shows an electrical schematic of an equivalent circuit that models the operation of the schematic of FIG. 3 in attenuation state.

FIG. 4 is an electrical schematic of an equivalent circuit that models the operation of the DSA cell 300 when the cell is in the attenuation state. In FIG. 3, the FETs 314 and 316 are in the OFF mode for the attenuation state. As shown in the figure, the FET 314 is represented by the FET's OFF mode capacitance 414 and the FET 316 is represented by the FET's OFF mode capacitance 416, where both have a value of $C_{M1OFF}$. The FET 324 is represented by its ON mode resistance 424 having a value of $R_{M2ON}$. ZS 424 is the input equivalent impedance of the cell looking into the IN-port 302 and Z0 444 is the output equivalent impedance of the cell looking into the OUT-port 312. The inductances 304, 310, 404 and 410 have an inductance value Lse. The resistances 306, 308, 406 and 408 have a value of R1. The inductance 322 has a value of Lsh. The resistance 320 has a value of R2.

From the equivalent circuit in FIG. 4, it can be seen the voltage loss Lv in the DSA cell from the input to the output is:

$$Lv = \cfrac{1}{\left[\cfrac{1}{R1 + jwLse} + jwC_{M1OFF}\right](R2 + R_{M2ON} + jwLsh)} + Z0 + 1 \qquad \text{Eq. 1}$$

Voltage loss Lv translates into insertion loss $S_{21}$. It can be seen from Eq. 1 that the loss in the attenuator is directly proportional to the value of Lse and inversely proportional to the values of Lsh and $C_{M1OFF}$.

In one embodiment, it can be assumed that the value of $C_{M1OFF}$ and Lsh are very low and have no significant effect in the frequency of operation. Furthermore, it can be assumed that the value of $R_{M2ON}$ is very low and has no significant effect on the $S_{21}$ of the DSA cell. Therefore, Eq. 1 reduces to:

$$Lv \approx \frac{R1 + jwLse}{R2} + Z0 + 1 \qquad \text{Eq. 2}$$

We can now clearly see that Lv, which translates into insertion loss $S_{21}$, is directly proportional to the value of inductance Lse. The higher the value of Lse, the more the term 'jwLse' increases with frequency, thus increasing the insertion loss of the DSA cell as a function of frequency in attenuation state.

In an alternate embodiment, it can be assumed that the value of $C_{M1OFF}$ and Lse are very low and have no significant effect in the frequency of operation. Furthermore, it can be assumed that the value of $R_{M2ON}$ is very low and has no significant effect on the $S_{21}$ of the DSA cell. Therefore, Eq. 1 reduces to:

$$Lv \approx \frac{R1}{R2 + jwLsh} + Z0 + 1 \qquad \text{Eq. 3}$$

It can now be seen that Lv, which translates into insertion loss $S_{21}$, is inversely proportional to the value of inductance Lsh. The higher the value of Lsh, the higher value of the denominator of the term $$\frac{R1}{R2+jwLsh},$$

will be, thus the value of the term decreases with frequency, which in turn reduces the insertion loss of the DSA cell.

In another alternate embodiment, it can be assumed that the values of Lse and Lsh are very low. For a small attenuation of the DSA cell, the value of R2 in FIG. 4 is very high and the value of R1 is closer to 1. Therefore, Eq. 1 reduces to:

$$Lv \approx \frac{1}{[1+jwC_{M1OFF}]R2} + Z0 + 1 \qquad \text{Eq. 4}$$

It can now be seen that Lv, which translates into insertion loss $S_{21}$, is not significantly affected by $C_{M1OFF}$, which means that the OFF mode capacitance of the switches 314 and 316 have less affect on the frequency response of $S_{21}$ for lower attenuation values of DSA cell. If the value of the term '1+1/jwCoff' is close to 1, then Eq. 4 further reduces to:

$$Lv \approx \frac{1}{R2} + Z0 + 1 \qquad \text{Eq. 5}$$

It can be seen that R2 contributes significantly towards the insertion loss of the DSA cell.

For higher attenuation values, the value of R1 is high, thus the value of $C_{M1OFF}$ has a significant effect on the insertion loss of the DSA cell. This can be seen from the Eq. 6:

$$Lv = \frac{1}{[jwC_{M1OFF}]} * \frac{1}{R2} + Z0 + 1 \qquad \text{Eq. 6}$$

The larger the value of $C_{M1OFF}$, the lower the value of Lv, which translates into insertion loss $S_{21}$.

In yet another alternate embodiment, the voltage loss in the DSA cell is:

$$Lv = \frac{1}{\left[\frac{1}{R1+jwLse}+jwC_{M1OFF}\right]} * \frac{1}{R2} + Z0 + 1 \qquad \text{Eq. 7}$$

For the term Lse to nullify the effect of $C_{M1OFF}$ such that a broadband performance can be obtained, the first term in Eq. 7 should equal R1/R2, thus the value of Lse is given by:

$$Lse = \left|\frac{R1^2 * C_{M1OFF}}{(1-jwC_{M1OFF}R1)}\right| \qquad \text{Eq. 8}$$

It can be seen from Eq. 8 that the value of Lse can now be determined such that the insertion loss of the DSA can be controlled for a particular frequency.

By adjusting the inductance value of the series inductors 304 and 310 to a desired inductance value, the slope of insertion loss $S_{21}$ in attenuation state can be adjusted to be the same as the slope of $S_{21}$ in the reference state. By altering the inductance value of the series inductors 304 and 310 to the desired inductance value, the slope of $S_{21}$ in attenuation state can be adjusted to have a flat response as a function of operating frequency. Thus, a desired inductance value is that inductance value which causes the slope of the insertion loss in the attenuation state to match the slope of the insertion loss in the reference state as a function of operating frequency.

Figure 5:
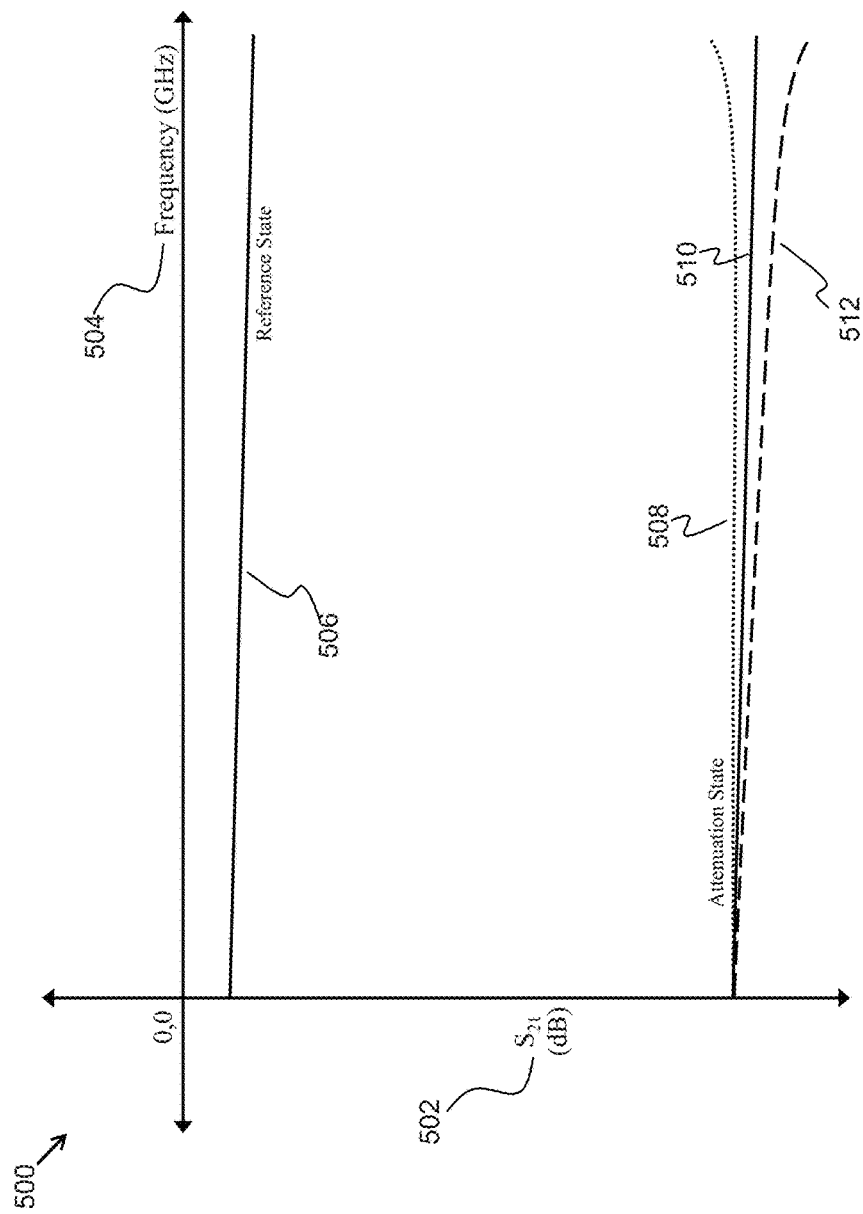
FIG. 5 shows a graph of insertion loss $S_{21}$ as a function of operating frequency in the reference state and in the attenuation state for the electrical schematic of FIG. 3.

FIG. 5 shows a graph of insertion loss $S_{21}$ as a function of operating frequency in the reference state and in the attenuation state for the electrical schematic of FIG. 3. Operating frequency 504 is shown on the X-axis and $S_{21}$ is shown on the Y-axis. The reference state $S_{21}$ response 506 is plotted as a function of operating frequency. In the attenuation state, the $S_{21}$ response is plotted for three different cases. In a first case, response 508 is plotted as a function of operating frequency where there is substantial positive roll-off. This is due to the value of series inductances 304 and 310 being too low, which allows the zero to dominate at higher frequencies. The zero is present as a result of the product of OFF mode source-to-drain capacitance of switches 314 and 316, and series resistances 306 and 308.

In a second case, response 512 is plotted as a function of operating frequency, where it shows a substantial negative roll-off. This is due to the value of series inductances 304 and 310 being too high, and the value of the product of OFF mode source-to-drain capacitance of switches 314 and 316, and series resistances 306 and 308 being too low.

In the third case, response 510 is plotted as a function of operating frequency, where it shows the attenuation state $S_{21}$ curve having the same slope as the reference state $S_{21}$ curve. This is achieved by adjusting the values of the series inductances 304 and 310 properly.

FIG. 6 shows an IC layout of the DSA cell with the electrical schematic in FIG. 3 in accordance with one embodiment of the presently disclosed apparatus, in which two series inductances 304 and 310 have higher values. The series resistance 306 is realized in this layout as three parallel resistors 306.1, 306.2 and 306.3. Similarly, the series resistance 308 is realized in this layout as three parallel resistors 308.1, 308.2 and 308.3. The inductor 304 is realized as a conductive trace 604 and the inductor 310 is realized as a conductive trace 610. These conductive traces 604 and 610 have a distributed inductance over their lengths that are modeled in the schematic of FIG. 3 as lumped elements 304 and 310. In addition, the conductive trace 622 has a parasitic inductance that is modeled in the schematic of FIG. 3 as lumped element 322.

The methodology to adjust the slope of $S_{21}$ as a function of frequency in accordance with embodiments of the presently disclosed method will now be described in more detail. The slope of $S_{21}$ as a function of frequency is a function of the value of inductances 304 and 310. The value of inductances 304 and 310 can be adjusted by a) adjusting the length of the conductive traces 604 and 610 in the layout, b) by adjusting the width of the conductive traces 604 and 610 in the layout, c) by altering the location of input port 302 and output port 312, or d) by choosing the relative disposition of the layout of the series resistances with respect to the layout of the switch elements, and e) by any combination of such methods.

By increasing the length of the conductive traces 604 and 610, the values of the inductances 304 and 310 can be increased to counteract the effects of the zero in the transfer function and prevent positive roll-off of the slope of the $S_{21}$ in the attenuation state. Further, by widening the conductive traces 604 and 610, the values of the inductances 304 and 310 can be reduced, in order to prevent negative roll-off of the slope of the $S_{21}$ in the attenuation state.

Figure 7:
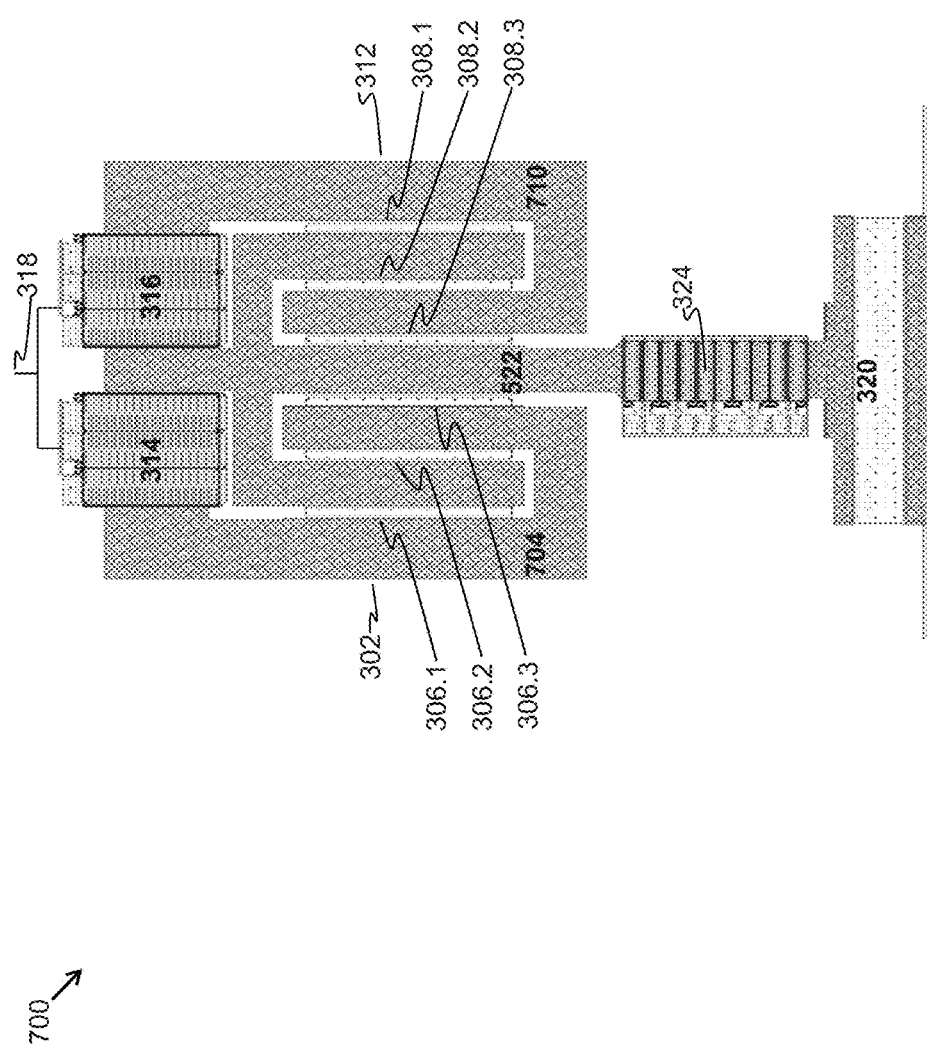
FIG. 7 shows an IC layout of the DSA cell with the electrical schematic in FIG. 3, in accordance with an alternative embodiment of the presently disclosed apparatus, in which the two series compensation inductances have been reduced in value in order to flatten out the response of $S_{21}$ as a function of operating frequency in the attenuation state.

FIG. 7 shows an IC layout of the DSA cell with the electrical schematic in FIG. 3, in accordance with an alternative embodiment of the presently disclosed apparatus and method, in which two series inductances 304 and 310 have lower values. Conductive trace 704 of FIG. 7 is modeled in the schematic of FIG. 3 as lumped series inductor 304. Similarly, conductive trace 710 of FIG. 7 is modeled in the schematic of FIG. 3 as lumped series inductor 310. By widening the conductive trace 704 and 710, the values of inductances 304 and 310 are reduced, which results in flattening out the slope of slope of $S_{21}$ in the attenuation state for the desired operating frequency.

Figure 8:
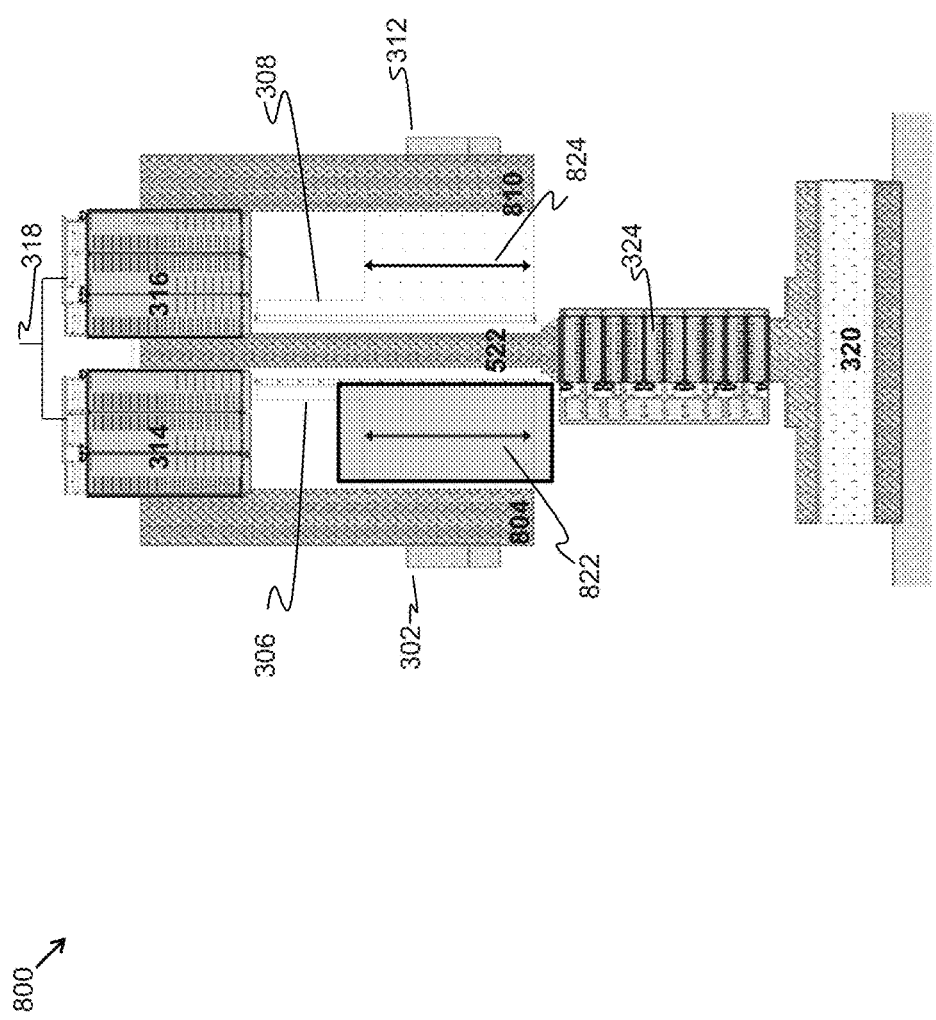
FIG. 8 shows an IC layout of the DSA cell with the electrical schematic in FIG. 3, in accordance with an alternative embodiment of the presently disclosed apparatus, in which the width of the conductor trace is increased in order to reduce the value of the series compensation inductances.

FIG. 8 shows an IC layout of the DSA cell with the electrical schematic in FIG. 3, in accordance with an alternative embodiment of the presently disclosed apparatus and method, in which two series resistances 306 and 308 have been realized in the layout by single resistors 306 and 308. Further, the width of the conductive traces 822 and 824 has been increased to further reduce the value of the inductances 304 and 310 of FIG. 3.

Figures 9A, 9B:
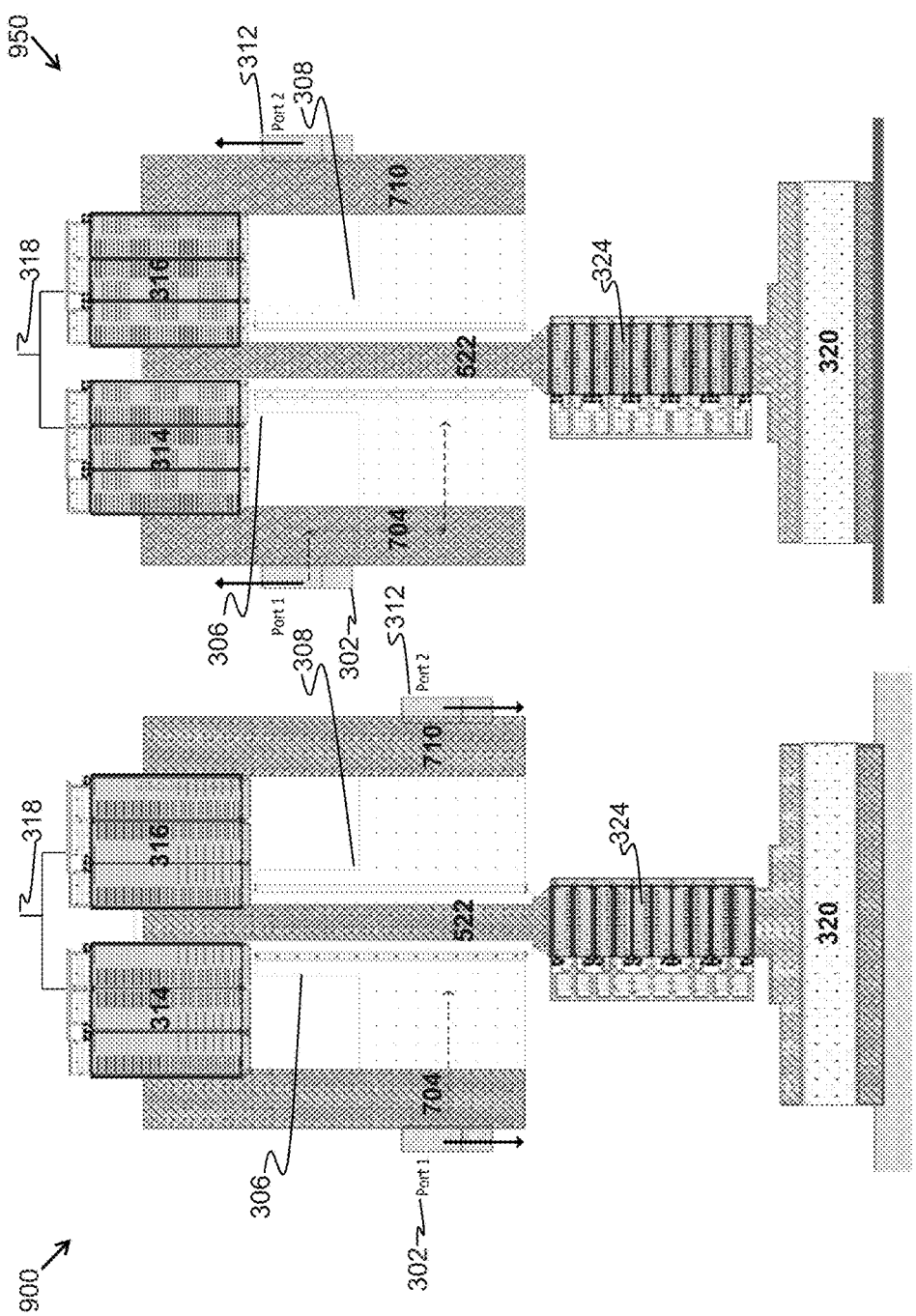
FIG. 9A shows an IC layout of the DSA cell with the electrical schematic in FIG. 3, in accordance with an alternative embodiment of the presently disclosed apparatus, in which the value of the series compensation inductances is reduced by moving the position of input and output ports to the lower part of the layout.
FIG. 9B shows an IC layout of the DSA cell with the electrical schematic in FIG. 3, in accordance with an alternative embodiment of the presently disclosed apparatus, in which the value of the series compensation inductances is increased by moving the position of input and output ports to the upper part of the layout.

FIG. 9A shows an IC layout of the DSA cell with the electrical schematic in FIG. 3, in accordance with an alternative embodiment of the presently disclosed apparatus and method, in which the locations of the input port 302 and output port 312 have been altered and moved towards the lower portion of the layout. By moving the location of the ports lower, the value of inductance of 304 and 310 are reduced, which leads to flattening of the slope of insertion loss $S_{21}$ in the attenuation state.

FIG. 9B shows an IC layout of the DSA cell with the electrical schematic in FIG. 3, in accordance with an alternative embodiment of the presently disclosed apparatus and method, in which the locations of the input port 302 and output port 312 have been altered and moved towards the higher portion of the layout. By moving the location of the ports higher, the value of inductance of 304 and 310 are increased, which can prevent roll-off of the slope of $S_{21}$ in the attenuation state.

Figure 10:
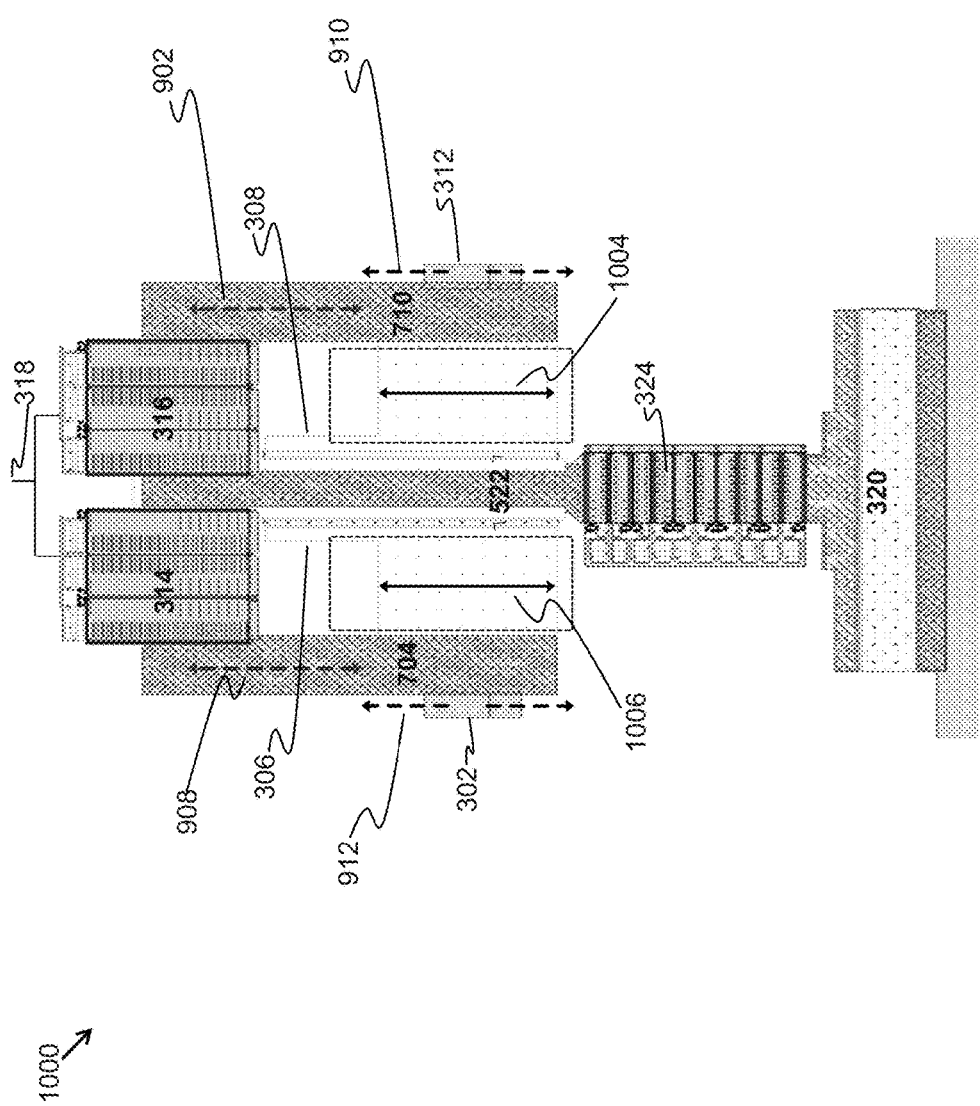
FIG. 10 shows an IC layout of the DSA cell with the electrical schematic in FIG. 3, in accordance with an alternative embodiment of the presently disclosed apparatus, in which the value of the series compensation inductances is adjusted both by moving the position of input and output ports to the upper or lower part of the layout, and the width of the conductor trace is adjusted, in order to adjust the value of the series inductances.

FIG. 10 shows an IC layout of the DSA cell with the electrical schematic in FIG. 3, in accordance with an alternative embodiment of the presently disclosed apparatus and method, in which both the width of the conductive traces 704 and 710 were adjusted, and the locations of the input and output ports were altered in order to achieve optimal slope of the slope of $S_{21}$ in the attenuation state. Further, the series resistances 306 and 308 have been realized in the layout by a single resistor. The power handling of the attenuator is a function of the density of resistance material used for resistors 306 and 308. For a fixed width of the resistor, more power handling can be achieved by the resistors 306 and 308 when the density of the resistance material is lower. The area of the resistors can be altered by modifying the width and length of the resistors. However, the value of the series inductances 304 and 310 should actively be monitored in order to optimize the insertion loss of the DSA cell. The width of the resistors 306 and 308 determines how the two adjustment control parameters ("knobs") are used, namely adjusting the width and adjusting the location of the ports. This in turn will set the value of the series inductors 304 and 310.

Figure 11:
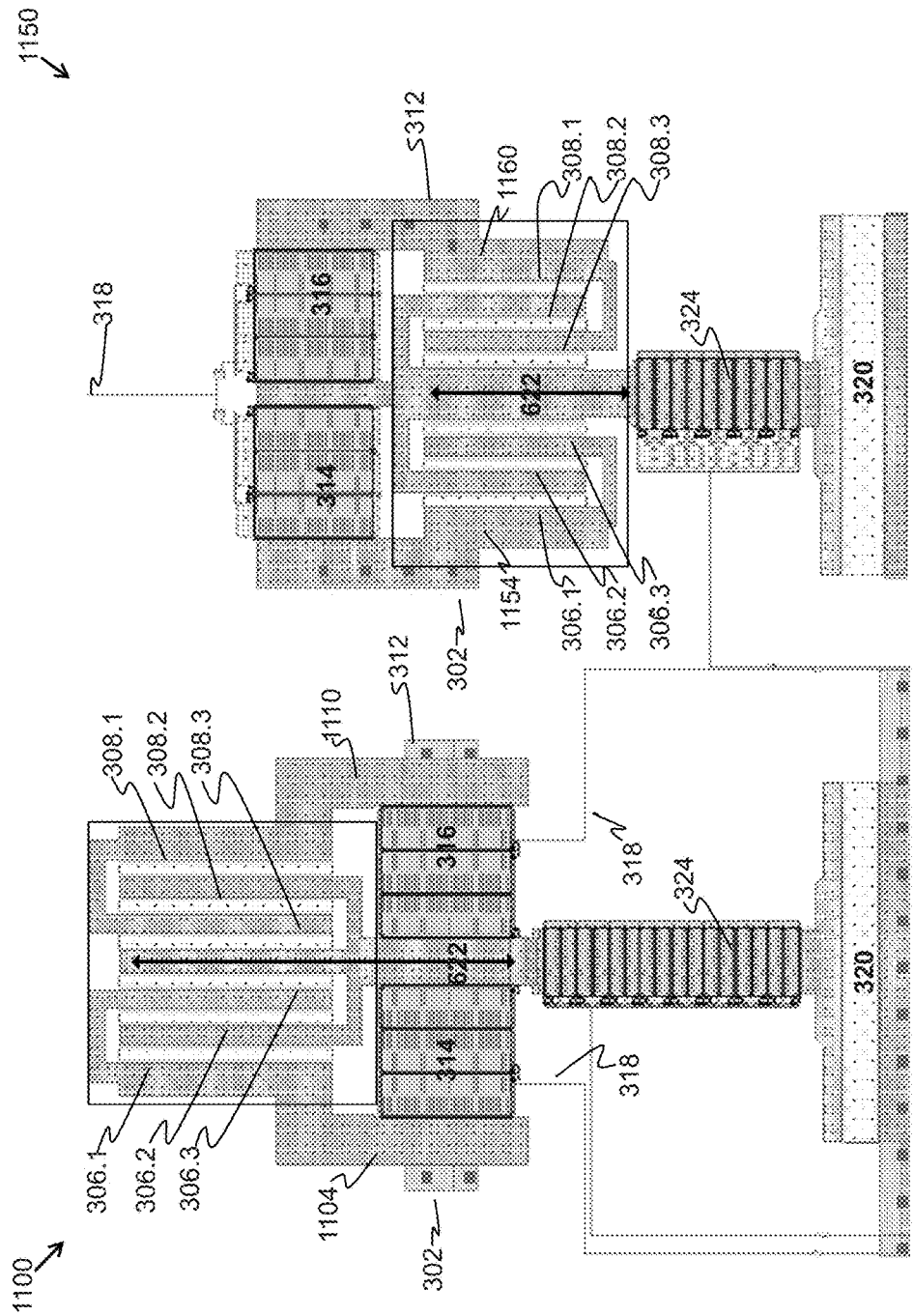
FIG. 11A shows an IC layout of the DSA cell with the electrical schematic in FIG. 3, in accordance with an alternative embodiment of the presently disclosed apparatus, in which the series resistors are moved above switches 314 and 316, in order to increase the length of the conductor trace forming a shunt inductance.
FIG. 11B shows an IC layout of the DSA cell with the electrical schematic in FIG. 3, in accordance with an alternative embodiment of the presently disclosed apparatus, in which the series resistors are moved below switches 314 and 316, in order to reduce the length of the conductor trace forming a shunt inductance.

FIG. 11A shows an IC layout of the DSA cell with the electrical schematic in FIG. 3, in accordance with an alternative embodiment of the presently disclosed apparatus and method, in which the conductive trace 622 has a longer length, which increases the value of the inductance 322. If the value of inductance 322, also referred to as shunt inductance, is too high, it can cause insertion loss $S_{21}$ to have a zero which results in a positive roll-off, that is reduced attenuation at higher frequencies. The relative location of resistors 306 and 308 in the layout determines the length of conductive trace 622 and thus the value of shunt inductance 322. Conductive traces 1104 and 1110 are modeled as lumped inductors 304 and 310 in the schematic of FIG. 3.

FIG. 11B shows an IC layout of the DSA cell with the electrical schematic in FIG. 3, in accordance with an alternative embodiment of the presently disclosed apparatus and method, in which the conductive trace 622 has a shorter length, which reduces the value of the inductance 322. The location of layout of series resistors 306 and 308 has been moved to below switches 314 and 316. This in turn reduces the length of the conductive trace 622, which leads to lower value of inductance of inductor 322. By the reducing the value of shunt inductor 322, a flattening of the slope of $S_{21}$ in the attenuation state can be obtained for frequencies higher than 40 GHZ.

Figure 12:
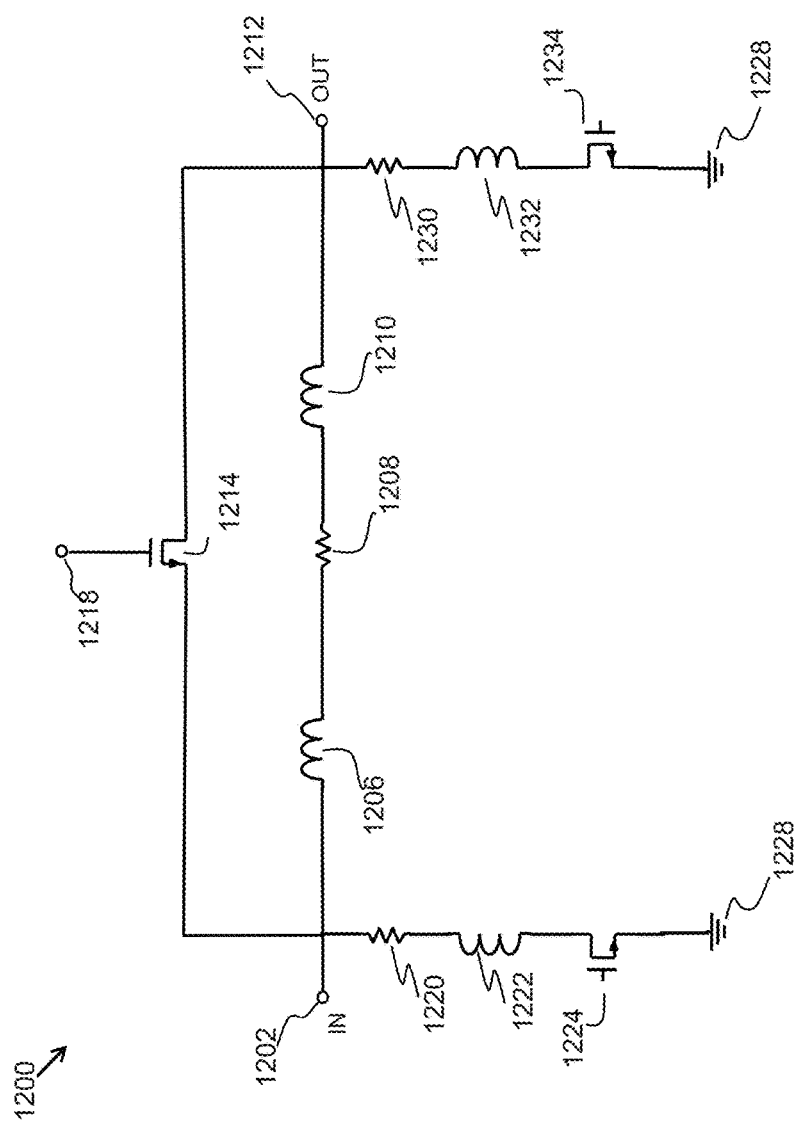
FIG. 12 shows a schematic of another embodiment of a DSA cell in which the attenuator is configured as a Pi-attenuator.

FIG. 12 shows an electrical schematic of a digital step attenuator (DSA) cell 1200 in accordance with another alternative embodiment in which the DSA cell is configured as a Pi-attenuator. Compared to schematic of FIG. 3, switch 316 has been replaced with a short and resistor 308 has been replaced with a short. Further, connection point 307 has been removed. Additional resistance 1230, inductance 1232 and switch 1234 are added.

Figure 13:
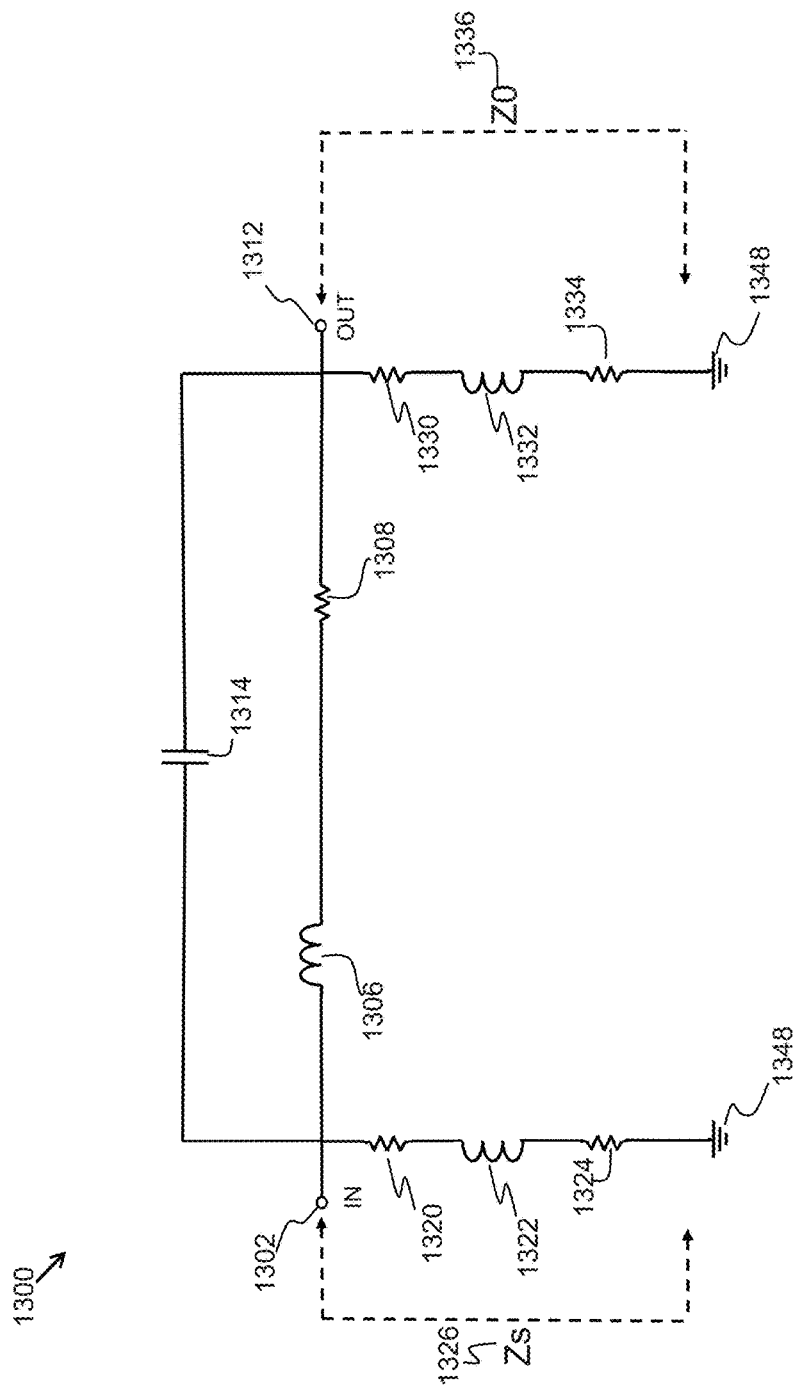
FIG. 13 shows an electrical schematic of an equivalent circuit that models the operation of the schematic in FIG. 12.

FIG. 13 is an electrical schematic of an equivalent circuit that models the operation of the DSA cell 1200 when the cell is in the attenuation state. The FET 1214 is in the OFF state. As shown in the figure, FET 1214 is represented by the FET's OFF mode capacitance 1314, having a value of $C_{M1OFF}$. FET 1224 is represented by its ON mode resistance 1324 having a value of $R_{M2ON}$ and FET 1234 is represented by its ON mode resistance 1334 having a value of $R_{M2ON}$. ZS 1326 is the input equivalent impedance of the cell looking into the IN-port 1302 and Z0 1336 is the output equivalent impedance of the cell looking into the OUT-port 1312. The inductances 1206 and 1210 have a lumped inductance value Lse. The resistance 1208 has a value of R1. Inductance 1322 has a value of Lsh and inductance 1332 has a value of Lsh. Resistance 1222 has a value of R2 and resistance 1232 has a value of R2'.

From the equivalent circuit in FIG. 13, it can be seen that the voltage loss Lv in the DSA cell from the input to the output is:

$$LV = \left[(R_1 + jwL_{se}) \| \frac{1}{jwC_{M1OFF}}\right]\left[\frac{1}{R + jwL_{sh}} + \frac{1}{Z_0}\right] + 1 \qquad \text{Eq. 9}$$

Using the same methodology used for FIG. 4 and in paragraphs [0041] to [0045], it can be shown how inductance value Lse, or inductance value Lsh, or OFF mode capacitance of the switch $C_{M1OFF}$ individually affect the slope of $S_{21}$ over a frequency range for the Pi-attenuator:

Effect of Inductance Value Lse:

$$Lv = (R_1 + jwL_{se})\left[\frac{1}{R_2} + \frac{1}{Z_0}\right] + 1 \qquad \text{Eq. 10}$$

Effect of Inductance Lsh:

$$Lv = R_1 \left[ \frac{1}{R_2 + jwL_{sh}} + \frac{1}{Z_0} \right] + 1 \quad \text{Eq. 11}$$

Effect of $C_{M1OFF}$ Assuming Low Values for Lse and Lsh:

$$Lv = \frac{1}{\frac{1}{R_1} + jwC_{M1OFF}} \left[ \frac{1}{R_2} + \frac{1}{Z_0} \right] + 1 \quad \text{Eq. 12}$$

Effect of $C_{M1OFF}$ Assuming High Attenuation Values:

$$Lv \approx \frac{1}{jwC_{M1OFF}} \left[ \frac{1}{R_2} + \frac{1}{Z_0} \right] + 1 \quad \text{Eq. 13}$$

From Eq. 13, it can be seen that insertion loss $S_{21}$ of Pi-attenuator is inversely proportional to $C_{M1OFF}$.

In an alternate embodiment, the loss in the Pi-attenuator is:

$$Lv = \frac{1}{\frac{1}{(R_1 + jwL_{se})} + jwC_{M1OFF}} \left[ \frac{1}{R_2} + \frac{1}{Z_0} \right] + 1 \quad \text{Eq. 14}$$

In order for Lse to nullify the effect of $C_{M1OFF}$, the first term in Eq. 14 should be equal to R1, therefore:

$$Lse = \left| \frac{R1^2 * C_{M1OFF}}{(1 - jwC_{M1OFF}R1)} \right| \quad \text{Eq. 15}$$

It can be seen from Eq. 15 that the value of Lse can now be determined such that the insertion loss of the Pi-attenuator can be controlled.

Figure 14:
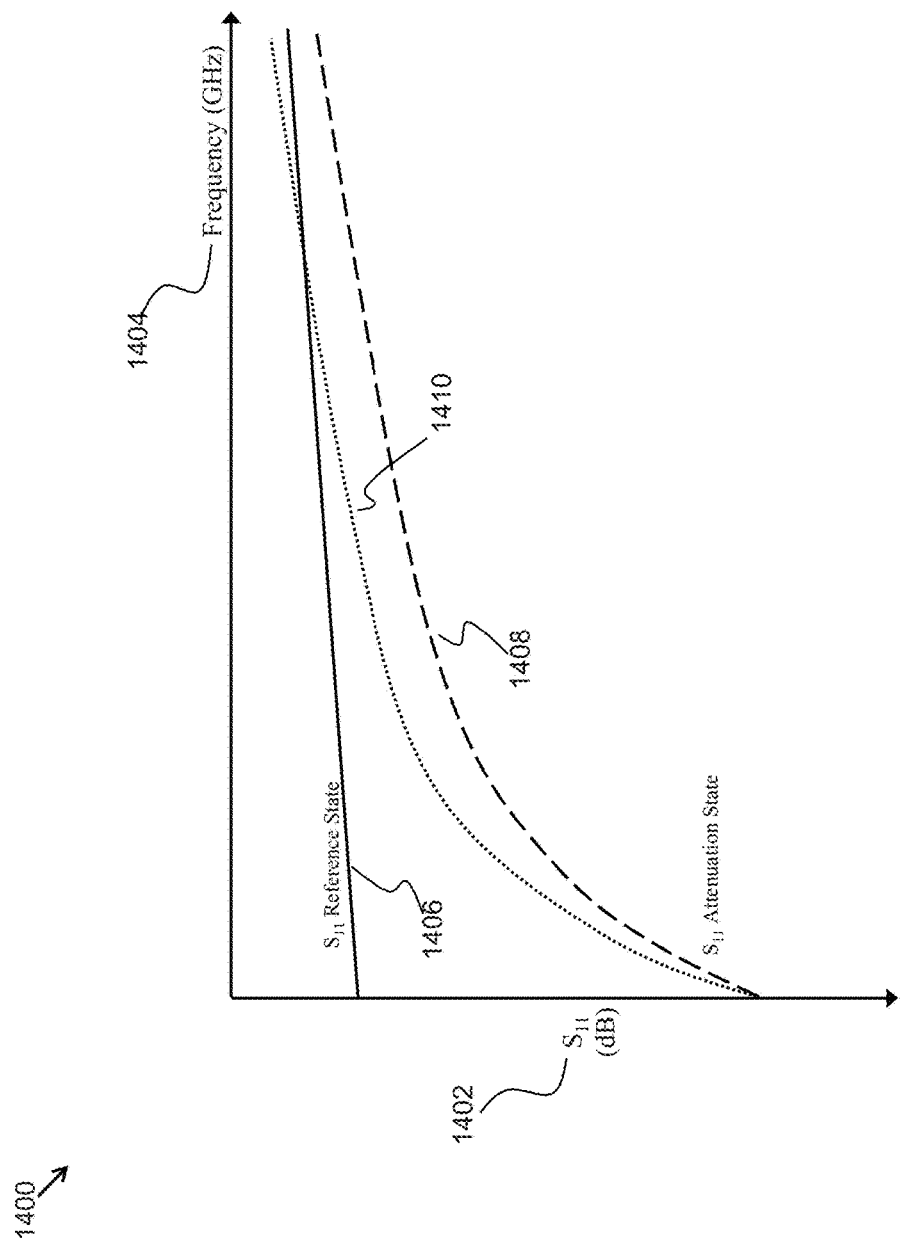
FIG. 14 shows a graph of return loss $S_{11}$, as a function of operating frequency in the reference state and in the attenuation state for the electrical schematic of FIG. 3.

FIG. 14 shows a graph of the return loss $S_{11}$ as a function of operating frequency in the reference state and in the attenuation state for the electrical schematic of FIG. 3. Operating frequency 1404 is shown on the X-axis and $S_{11}$ is shown on the Y-axis. This graph shows the additional benefit of reducing the return loss 1408 in attenuation state by optimizing the value of shunt inductance 322. 1410 shows the return loss in attenuation state which is high, because the shunt inductance 322 was not optimized. The person skilled in the art will understand that there is a tradeoff in optimizing the value of shunt inductance 322 when achieving a flat slope of the insertion loss $S_{21}$ in the attenuation state, while minimizing the return loss $S_{11}$.

Figure 15:
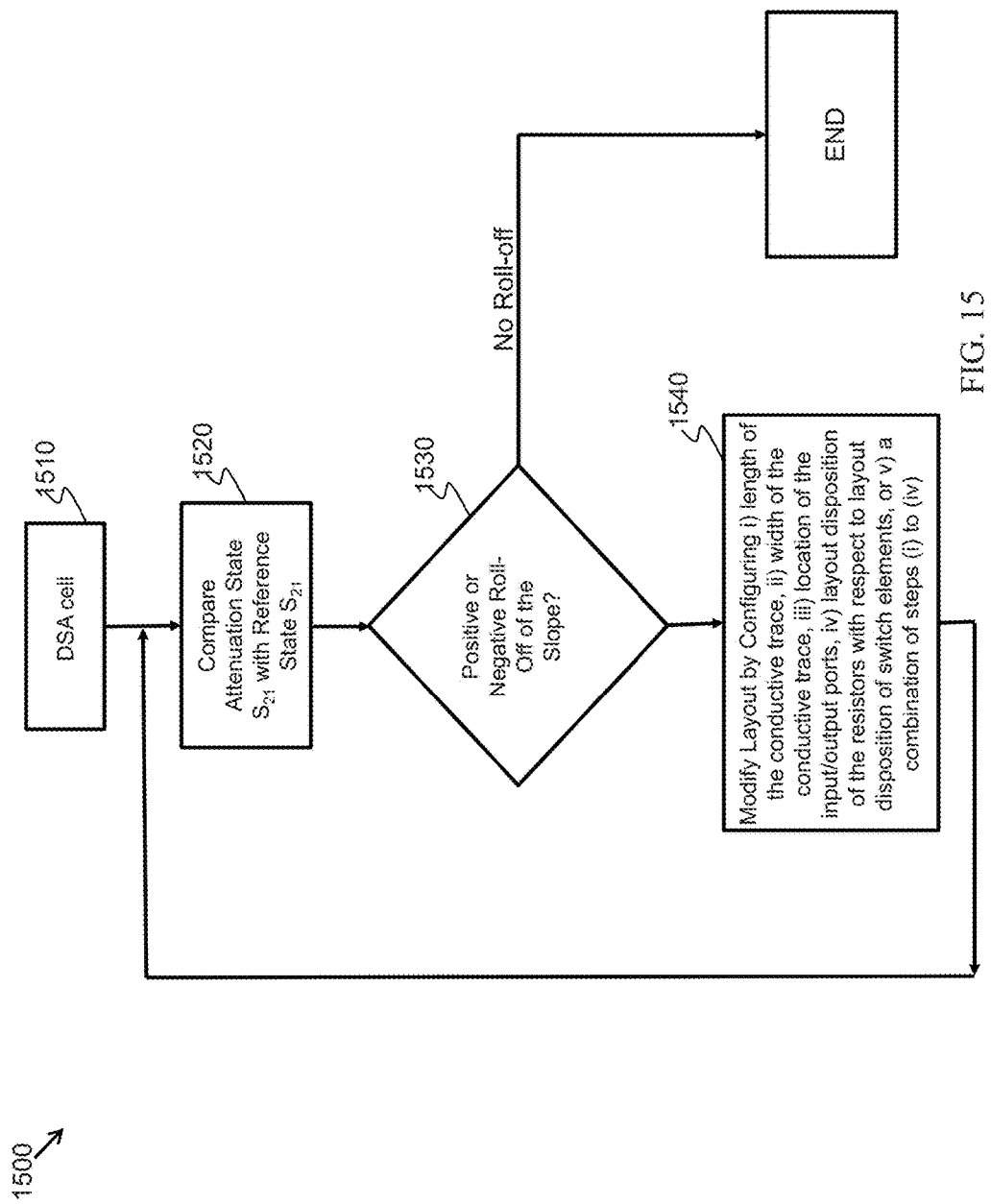
FIG. 15 shows a flow diagram of the disclosed method of adjusting the slope of the insertion loss as a function of frequency for the DSA by adjusting the i) length of the conductive trace, ii) width of the conductive trace, iii) location of input and/or output ports, iv) layout disposition of the resistors with respect to layout disposition of switch elements, or v) a combination of steps in (i) to (iv).

FIG. 15 shows a flow diagram of the disclosed method according to one embodiment. In steps 1510 and 1520, in a DSA cell, attenuation state insertion loss $S_{21}$ is compared with reference state insertion loss. Upon the completion of the comparison in step 1520, if the there is no insertion loss slope roll-off, then there is no further need to adjust any parameters. However, if there is positive or negative roll-off of the insertion loss slope, then subsequent steps in 1540 will be undertaken. In step 1540, the layout is modified by configuring i) length of the conductive trace 604 and/or 610, ii) width of the conductive trace 604 and/or 610, iii) location of the input and/or output ports, iv) layout disposition of the series resistors 306 and/or 308, or v) a combination of steps in (i) to (iv).

Upon completion of steps in 1540, a repetition of the comparison in step 1520 is conducted again, followed by steps in 1530 to determine if the adjustments conducted in step 1540 were adequate to remove the positive or negative insertion loss slope roll-off. If the adjustments were not adequate and there still exists a positive or negative insertion loss slope roll-off, another round of steps in 1540 can be undertaken. This process can be repeated until good results are achieved by removing slope of insertion loss of the DSA.

As should be readily apparent to one of ordinary skill in the art, various embodiments of the invention can be implemented to meet a wide variety of specifications. Unless otherwise noted above, selection of suitable component values is a matter of design choice and various embodiments of the invention may be implemented in any suitable IC technology (including but not limited to MOSFET structures), or in hybrid or discrete circuit forms. Integrated circuit embodiments may be fabricated using any suitable substrates and processes, including but not limited to standard bulk silicon, silicon-on-insulator (SOI), and silicon-on-sapphire (SOS). Unless otherwise noted above, the invention may be implemented in other transistor technologies such as bipolar, GaAs HBT, GaN HEMT, GaAs pHEMT, and MESFET technologies. Fabrication in CMOS on SOI or SOS processes enables circuits with low power consumption, the ability to withstand high power signals during operation due to FET stacking, good linearity, and high frequency operation (i.e., radio frequencies up to and exceeding 50 GHz). Monolithic IC implementation is particularly useful since parasitic capacitances generally can be kept low (or at a minimum, kept uniform across all units, permitting them to be compensated) by careful design.

Voltage levels may be adjusted or voltage and/or logic signal polarities reversed depending on a particular specification and/or implementing technology (e.g., NMOS, PMOS, or CMOS, and enhancement mode or depletion mode transistor devices). Component voltage, current, and power handling capabilities may be adapted as needed, for example, by adjusting device sizes, serially "stacking" components (particularly FETs) to withstand greater voltages, and/or using multiple components in parallel to handle greater currents. Additional circuit components may be added to enhance the capabilities of the disclosed circuits and/or to provide additional functional without significantly altering the functionality of the disclosed circuits.

The term "MOSFET", as used in this disclosure, means any field effect transistor (FET) with an insulated gate and comprising a metal or metal-like, insulator, and semiconductor structure. The terms "metal" or "metal-like" include at least one electrically conductive material (such as aluminum, copper, or other metal, or highly doped polysilicon, graphene, or other electrical conductor), "insulator" includes at least one insulating material (such as silicon oxide or other dielectric material), and "semiconductor" includes at least one semiconductor material.

A number of embodiments of the invention have been described. It is to be understood that various modifications may be made without departing from the spirit and scope of the invention. For example, some of the steps described above may be order independent, and thus can be performed in an order different from that described. Further, some of the steps described above may be optional. Various activities described with respect to the methods identified above can be executed in repetitive, serial, or parallel fashion.

It is to be understood that the foregoing description is intended to illustrate and not to limit the scope of the invention, which is defined by the scope of the following claims, and that other embodiments are within the scope of the claims. (Note that the parenthetical labels for claim elements are for ease of referring to such elements, and do not in themselves indicate a particular required ordering or enumeration of elements; further, such labels may be reused in dependent claims as references to additional elements without being regarded as starting a conflicting labeling sequence).

What is claimed is:

1. A method to control slope of insertion loss of a digital step attenuator (DSA) as a function of frequency, comprising:
   (a) providing a DSA having
      an input port;
      an output port;
      a first switch element having an input terminal, an output terminal and a control terminal, the output terminal coupled to the input port;
      a first resistive element having a first terminal and a second terminal;
      a first inductive coupling having an inductance, the first inductive coupling electrically connecting the output terminal of the first switch element to the first terminal of the first resistive element;
      a second inductive coupling having an inductance, the second inductive coupling coupled to the output port and electrically connecting the input terminal of the first switch element to the second terminal of the first resistive element,
      wherein the first inductive coupling is a first conductive trace coupling the output terminal of the first switch to the first terminal of the first resistive element,
   (b) adjusting positive or negative roll-off of slope of insertion loss as a function of frequency of the DSA by configuring one or more of
      i. length of the first conductive trace,
      ii. width of the first conductive trace, and
      iii. location of the input port,
      thus adjusting the slope of the insertion loss for a desired frequency range, and
   (c) adjusting the positive or negative roll-off of the slope of the insertion loss as a function of frequency of the DSA by configuring location of the output port.

2. A method to control slope of insertion loss of a digital step attenuator (DSA) as a function of frequency, comprising:
   (a) providing a DSA having
      an input port;
      an output port;
      a first switch element having an input terminal, an output terminal and a control terminal, the output terminal coupled to the input port;
      a first resistive element having a first terminal and a second terminal;
      a first inductive coupling having an inductance, the first inductive coupling electrically connecting the output terminal of the first switch element to the first terminal of the first resistive element;
      a second inductive coupling having an inductance, the second inductive coupling coupled to the output port and electrically connecting the input terminal of the first switch element to the second terminal of the first resistive element,
      wherein the first inductive coupling is a first conductive trace coupling the output terminal of the first switch to the first terminal of the first resistive element,
   (b) adjusting positive or negative roll-off of slope of insertion loss as a function of frequency of the DSA by configuring one or more of
      iv. length of the first conductive trace,
      v. width of the first conductive trace, and
      vi. location of the input port,
      thus adjusting the slope of the insertion loss for a desired frequency range, and
   (c) adjusting the positive or negative roll-off of the slope of the insertion loss as a function of frequency of the DSA by configuring layout disposition of the first resistive element with respect to layout disposition of the first switch element.

3. A digital step attenuator (DSA), comprising:
   (a) an input port;
   (b) an output port;
   (c) a first switch element having an input terminal, an output terminal and a control terminal, the output terminal coupled to the input port;
   (d) a first resistive element having a first terminal and a second terminal;
   (e) a first inductive coupling having an inductance, the first inductive coupling electrically connecting the output terminal of the first switch element to the first terminal of the first resistive element;
   (f) a second inductive coupling having an inductance, the second inductive coupling electrically connecting the input terminal of the first switch element to the second terminal of the first resistive element,
      wherein the first inductive coupling is a first conductive trace coupling the output terminal of the first switch to the first terminal of the resistive element, the first conductive trace having a length and a width configured to establish a desired inductance for the first inductive coupling;
   (g) a second resistive element having a first terminal and a second terminal, the first terminal of the second resistive element coupled to the second terminal of the first resistive element at a connection point;
   (h) a second switch element having an input terminal, an output terminal and a control terminal, the output terminal coupled to the output port and the input terminal of the second switch element coupled to the input terminal of the first switch element at the connection point;
   (i) a third resistive element having a first terminal and a second terminal, the first terminal coupled to the second terminal of the first resistive element and to the first terminal of the second resistive element at the connection point;
   (j) a third switch element having an input terminal, an output terminal and a control terminal, the input terminal coupled to ground, and
   (k) a third inductive coupling having an inductance, the third inductive coupling electrically connecting the output terminal of the third switch element to the second terminal of the third resistor.

4. The DSA according to claim 3, wherein the third inductive coupling is a conductive trace coupling the output terminal of the third switch to the second terminal of the resistive element, the conductive trace having a length and a width configured to establish a desired inductance for the third inductive coupling.

5. The DSA according to claim 4, wherein the desired inductance for the third inductive coupling results in the slope of the insertion loss of the DSA cell in attenuation state matching the slope of the insertion loss of the DSA cell in reference state for a desired frequency range.

6. The DSA according to claim 3, wherein the third switch element is a field effect transistor (FET) having a source, drain and gate, the input terminal being the source, the output terminal being the drain and the control terminal being the gate.

7. A digital step attenuator (DSA), comprising:
(a) an input port;
(b) an output port;
(c) a first switch element having an input terminal, an output terminal and a control terminal, the output terminal coupled to the input port;
(d) a first resistive element having a first terminal and a second terminal;
(e) a first inductive coupling having an inductance, the first inductive coupling electrically connecting the output terminal of the first switch element to the first terminal of the first resistive element;
(f) a second inductive coupling having an inductance, the second inductive coupling electrically connecting the input terminal of the first switch element to the second terminal of the first resistive element,
wherein the first inductive coupling is a first conductive trace coupling the output terminal of the first switch to the first terminal of the resistive element, the first conductive trace having a length and a width configured to establish a desired inductance for the first inductive coupling;
(g) a second resistive element having a first terminal and a second terminal, the first terminal of the second resistive element coupled to the second terminal of the first resistive element at a connection point;
(h) a second switch element having an input terminal, an output terminal and a control terminal, the output terminal coupled to the output port and the input terminal of the second switch element coupled to the input terminal of the first switch element at the connection point,
wherein the control terminal of the first switch and the control terminal of the second switch are coupled together.

\* \* \* \* \*